(12) United States Patent
Ma et al.

(10) Patent No.: US 10,171,112 B2
(45) Date of Patent: Jan. 1, 2019

(54) RF MULTIPLEXER WITH INTEGRATED DIRECTIONAL COUPLERS

(71) Applicant: QUALCOMM Incorporated, San Diego, CA (US)

(72) Inventors: Yunfei Ma, San Jose, CA (US); Chengjie Zuo, San Jose, CA (US); David Berdy, San Jose, CA (US); Daeik Kim, Del Mar, CA (US); Changhan Yun, San Jose, CA (US); Je-Hsiung Lan, San Jose, CA (US); Mario Velez, San Jose, CA (US); Niranjan Sunil Mudakatte, San Jose, CA (US); Robert Mikulka, Oceanside, CA (US); Jonghae Kim, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 79 days.

(21) Appl. No.: 15/080,472

(22) Filed: Mar. 24, 2016

(65) Prior Publication Data

US 2017/0279469 A1    Sep. 28, 2017

(51) Int. Cl.
*H01P 5/18* (2006.01)
*H04B 1/00* (2006.01)
*H04B 1/04* (2006.01)
*H04B 1/3827* (2015.01)
*H04B 1/40* (2015.01)
(Continued)

(52) U.S. Cl.
CPC .............. *H04B 1/0057* (2013.01); *H03H 7/09* (2013.01); *H03H 7/463* (2013.01); *H04B 1/04* (2013.01); *H04B 1/3827* (2013.01); *H04B 1/40* (2013.01); *H04L 5/14* (2013.01); *H04B 2001/0416* (2013.01)

(58) Field of Classification Search
CPC .................................. H01P 5/18; H03H 7/461
USPC .................................. 333/109–112, 116–119
See application file for complete search history.

(56) References Cited

U.S. PATENT DOCUMENTS 6,825,738 B2    11/2004  Shumovich
6,972,640 B2 *  12/2005  Nagamori ............... H01P 5/185
                                                                    333/109

(Continued)

FOREIGN PATENT DOCUMENTS

CN    101908881 A    12/2010
JP    2004242198 A    8/2004

OTHER PUBLICATIONS

International Search Report and Written Opinion—PCT/US2017/020281—ISA/EPO—dated Jun. 6, 2017.

*Primary Examiner* — Dean Takaoka
(74) *Attorney, Agent, or Firm* — Haynes and Boone, LLP

(57) ABSTRACT

An RF diplexer is provided that includes a first channel and a second channel. The first channel includes a first primary inductor. Similarly, the second channel includes a second primary inductor. A first directional coupler for the first channel includes a first transformer formed by the first primary inductor and also a first secondary inductor. A first terminal for the first secondary inductor is a coupled port for the first directional coupler. A second directional coupler for the second channel includes a second transformer formed by the second primary inductor and also a second secondary inductor. A first terminal for the second secondary inductor is a coupled port for the second directional coupler.

16 Claims, 5 Drawing Sheets

(51) Int. Cl.
*H04L 5/14* (2006.01)
*H03H 7/09* (2006.01)
*H03H 7/46* (2006.01)
*H01P 5/02* (2006.01)

(56) References Cited

U.S. PATENT DOCUMENTS

| | | | | |
|---|---|---|---|---|
| 7,149,496 B2* | 12/2006 | Horiuchi | | H04B 1/005 455/333 |
| 7,187,910 B2* | 3/2007 | Kim | | H01P 5/185 333/109 |
| 7,714,679 B2* | 5/2010 | Jiang | | H01P 5/185 333/116 |
| 8,130,787 B2* | 3/2012 | Hagiwara | | H04B 1/0057 370/463 |
| 8,315,576 B2* | 11/2012 | Jones | | H01P 5/184 333/109 |
| 8,606,198 B1* | 12/2013 | Wright | | H01P 5/18 333/109 |
| 8,773,216 B2* | 7/2014 | Dupont | | H01P 5/184 333/109 |
| 8,810,333 B2* | 8/2014 | Laporte | | H04B 1/0064 333/109 |
| 8,928,428 B2* | 1/2015 | Gorbachov | | H01P 5/185 333/109 |
| 2006/0140573 A1* | 6/2006 | Kim | | H04B 1/0483 385/147 |
| 2008/0136559 A1 | 6/2008 | Takahashi et al. | | |
| 2008/0186106 A1* | 8/2008 | Christian | | H03H 7/463 333/133 |
| 2011/0267194 A1 | 11/2011 | Hong et al. | | |
| 2013/0194054 A1 | 8/2013 | Presti | | |
| 2013/0207741 A1 | 8/2013 | Presti | | |
| 2014/0354372 A1 | 12/2014 | Zuo et al. | | |
| 2015/0042412 A1 | 2/2015 | Imbornone et al. | | |
| 2015/0381134 A1 | 12/2015 | Tanaka et al. | | |
| 2016/0079649 A1 | 3/2016 | Ilkov et al. | | |

\* cited by examiner

RF MULTIPLEXER WITH INTEGRATED DIRECTIONAL COUPLERS

TECHNICAL FIELD

This application relates to an RF multiplexer, and more particularly to an RF multiplexer with integrated directional couplers.

BACKGROUND

Front end components such as directional couplers and radio frequency (RF) multiplexers have numerous applications in devices such as cellular phones. For example, carrier aggregation provides increased bandwidth in modern 4G communication protocols in which a handset communicates over multiple component carriers. Each component carrier has a certain bandwidth centered about a corresponding center frequency. Although a 4G transmitter may thus communicate over different carrier components (and thus over different frequency bands), it is conventional that this communication occur through a common antenna (or antennas). For example, a transmitter may drive a low-pass channel corresponding to a lower frequency carrier component and also drive a mid-band channel corresponding to a higher frequency carrier component. The two channels couple through a diplexer (RF multiplexer) to drive the common antenna(s). In addition, the transmitter needs feedback information to control the power of the signals through the different frequency channels.

It is thus conventional to include a directional coupler for each channel as shown in FIG. 1 for a transmitter 100. The low-band (LB) channel includes an LB power amplifier (PA) module that drives a LB directional coupler 105 that in turn drives an RF multiplexer 115. RF multiplexer 115 may drive an antenna with the low-band signal from LB directional coupler 105. A coupled port from LB directional coupler 105 provides a feedback signal (LB_cp) that is an attenuated version of the directional coupler output—e.g., LB_cp may be attenuated by −20 dB as compared to the LB directional coupler output signal driving RF multiplexer 115. Transmitter 100 uses the low-band feedback signal LB_cp for power control of the LB band transmission. Similarly, a mid-band (MB) channel includes a MB PA module that drives an MB directional coupler 110 that in turn drives RF multiplexer 115 and ultimately the common antenna. MB directional coupler 110 provides a MB feedback signal (MB_cp) from its coupled port so that transmitter 100 may control the power of the MB signal.

Given the serial arrangement of LB directional coupler 105 to RF multiplexer 115, the insertion loss in the LB channel is thus a sum of the insertion loss from LB directional coupler 105 and also RF multiplexer 115. Similarly, the insertion loss in the MB channel is a sum of the insertion loss from MB directional coupler 110 and RF multiplexer 115. In addition, the three separate components (the pair of directional couplers and RF multiplexer) demand a significant amount of die space.

Accordingly there is a need in the art for directional couplers and RF multiplexers providing increased density and lower insertion loss.

SUMMARY

An RF diplexer is provided with a plurality of channels and a corresponding plurality of integrated directional couplers. The RF diplexer includes a plurality of primary inductors corresponding to the plurality of channels. The primary inductors are shared with the integrated directional couplers such that each integrated directional coupler includes a corresponding one of the primary inductors. Each integrated directional coupler also includes a secondary inductor arranged to form a transformer with the directional coupler's primary inductor. The resulting sharing of the primary inductor for each channel between the RF diplexer and the corresponding directional coupler is quite advantageous with regard to lowering insertion loss and manufacturing complexity and cost.

These advantageous features may be better appreciated through the disclosure of the following example embodiments.

BRIEF DESCRIPTION OF THE DRAWINGS

Embodiments of the disclosure and their advantages are best understood by referring to the detailed description that follows. It should be appreciated that like reference numerals are used to identify like elements illustrated in one or more of the figures.

DETAILED DESCRIPTION

To provide reduced insertion loss and dramatically improved density, an RF diplexer is provided in that includes an integrated directional coupler for each channel. Each integrated directional coupler includes a transformer having a primary inductor and a second inductor. The primary inductor also functions as part of the signal path for the corresponding channel in the RF diplexer. Each primary inductor may be formed as a plurality of coils in a corresponding plurality of metal layers covering a substrate such as a glass substrate in a passive-on-glass (PoG) embodiment. The use of a plurality of metal layers provides the primary inductor with a high quality (Q) factor, which is desirable to lower the insertion loss for the RF diplexer. The secondary inductor may be formed as a coil in another metal layer covering the substrate. Since this secondary inductor is used to form the channel's feedback signal, the Q factor for the secondary inductor need not be as high as the Q factor for the primary inductor. The secondary inductor may thus be formed in just a single metal layer in some embodiments to preserve density and lower manufacturing costs. A terminal for each secondary inductor forms a coupled port for the corresponding directional coupler to provide the directional coupler's feedback signal. Since the primary inductor and the secondary inductor in each channel are arranged to form a transformer, a channel transmission signal driven through the primary inductor magnetically couples into the secondary inductor to provide the channel's coupled port feedback signal.

Figure 1:
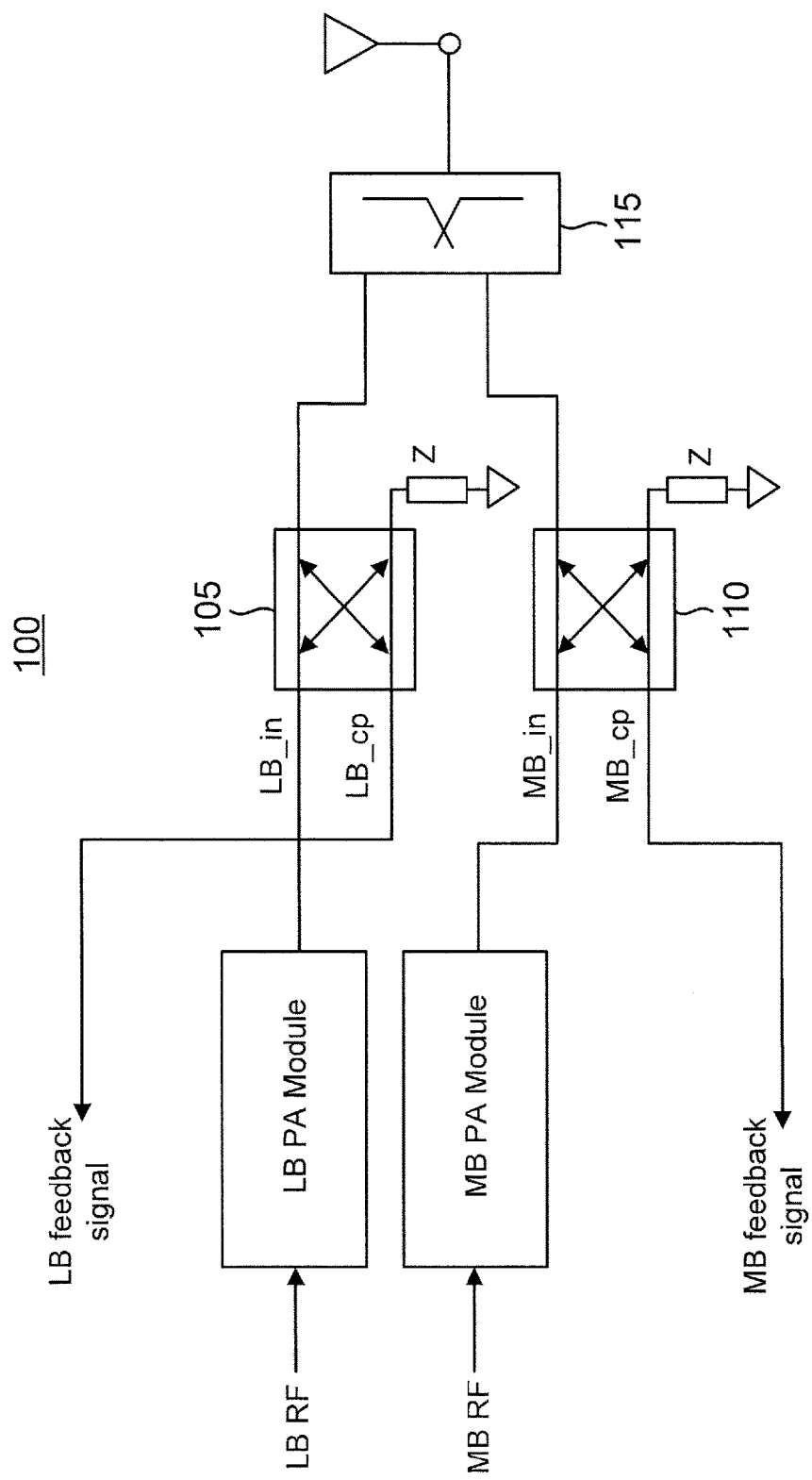
FIG. 1 illustrates a conventional transmitter including directional couplers and an RF multiplexer.
Figure 2:
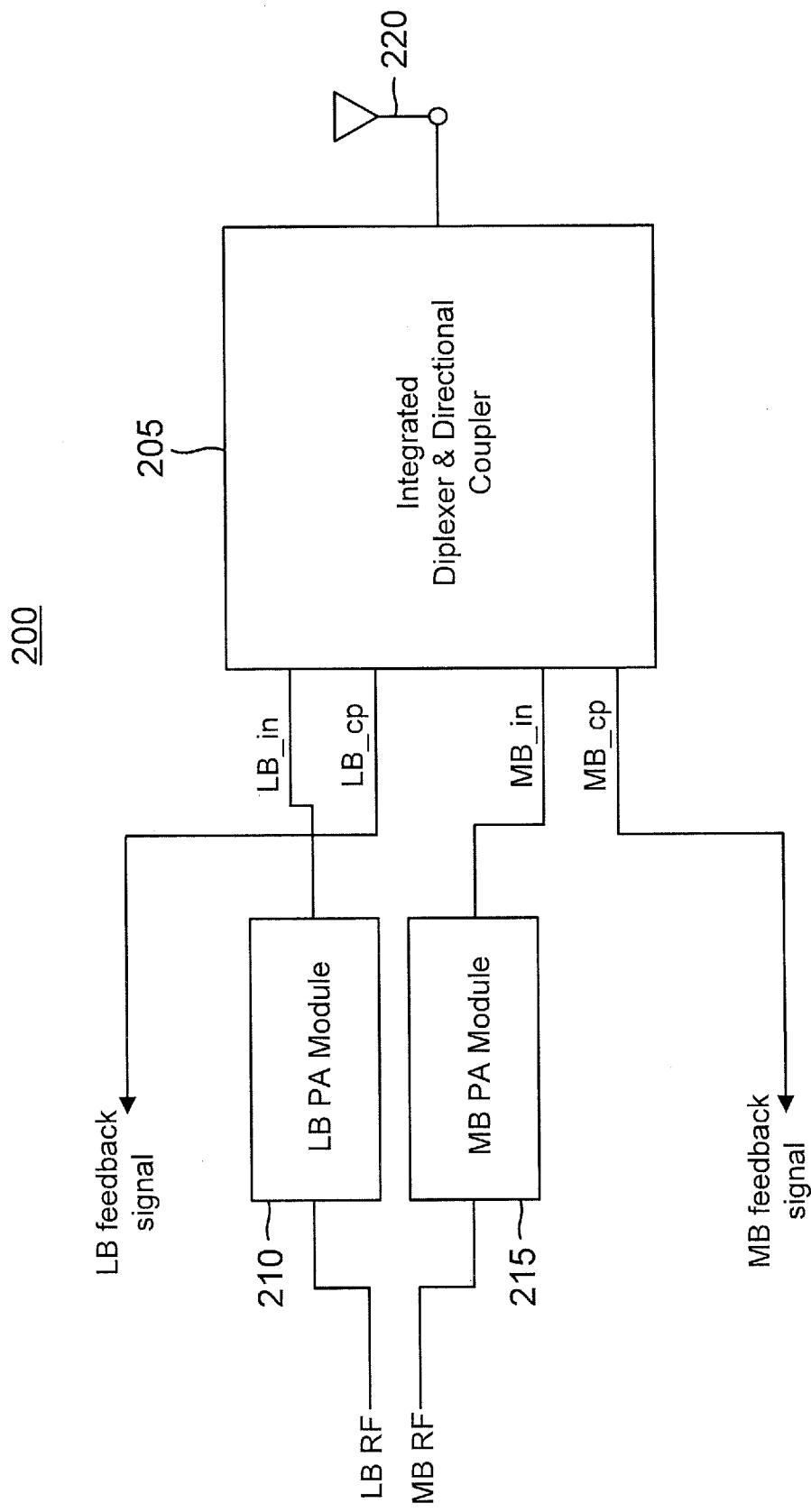
FIG. 2 illustrates a transmitter including an RF diplexer integrated with a pair of directional couplers in accordance with an aspect of the disclosure.

An example transmitter 200 including an RF diplexer 205 with integrated directional couplers is shown in FIG. 2. In RF diplexer 205, a first channel is a low-band (LB) channel and a second channel is a mid-band (MB) channel. But it will be appreciated that the frequency of the channels may be changed in alternative embodiments. For the LB channel, integrated RF diplexer 205 include a low-band input port (LB_in) and a low-band coupled port (LB_cp) as discussed with regard to conventional LB directional coupler 105 of FIG. 1. Similarly, integrated RF diplexer 205 includes for the MB channel a mid-band input port (MB_in) and a mid-band coupled port (MB_cp) as discussed with regard to conventional MB directional coupler 110. The low-band coupled port LB_cp provides the low-band (LB) feedback signal whereas the mid-band coupled port MB_cp provides the mid-band (MB) feedback signal. A LB power amplifier module 210 amplifies an input LB RF signal to drive the LB input port LB_in with the resulting amplified LB RF signal. LP power amplifier module 210 is configured to regulate its amplification responsive to the LB feedback signal so that the desired amount of power for the LB channel is delivered to an antenna 220. Similarly, a MB power amplifier module 215 amplifies an input MB RF signal to drive the MB input port MB_in for RF diplexer 205 with the resulting amplified MB RF signal. MB power amplifier module 215 is configured to regulate its amplification responsive to the MB feedback signal so that the desired amount of power for the MB channel is delivered to antenna 220. Both the amplified MB RF signal and the amplified LB RF signal couple through RF diplexer 205 to drive a common antenna (or antennas) 220.

Figure 3:
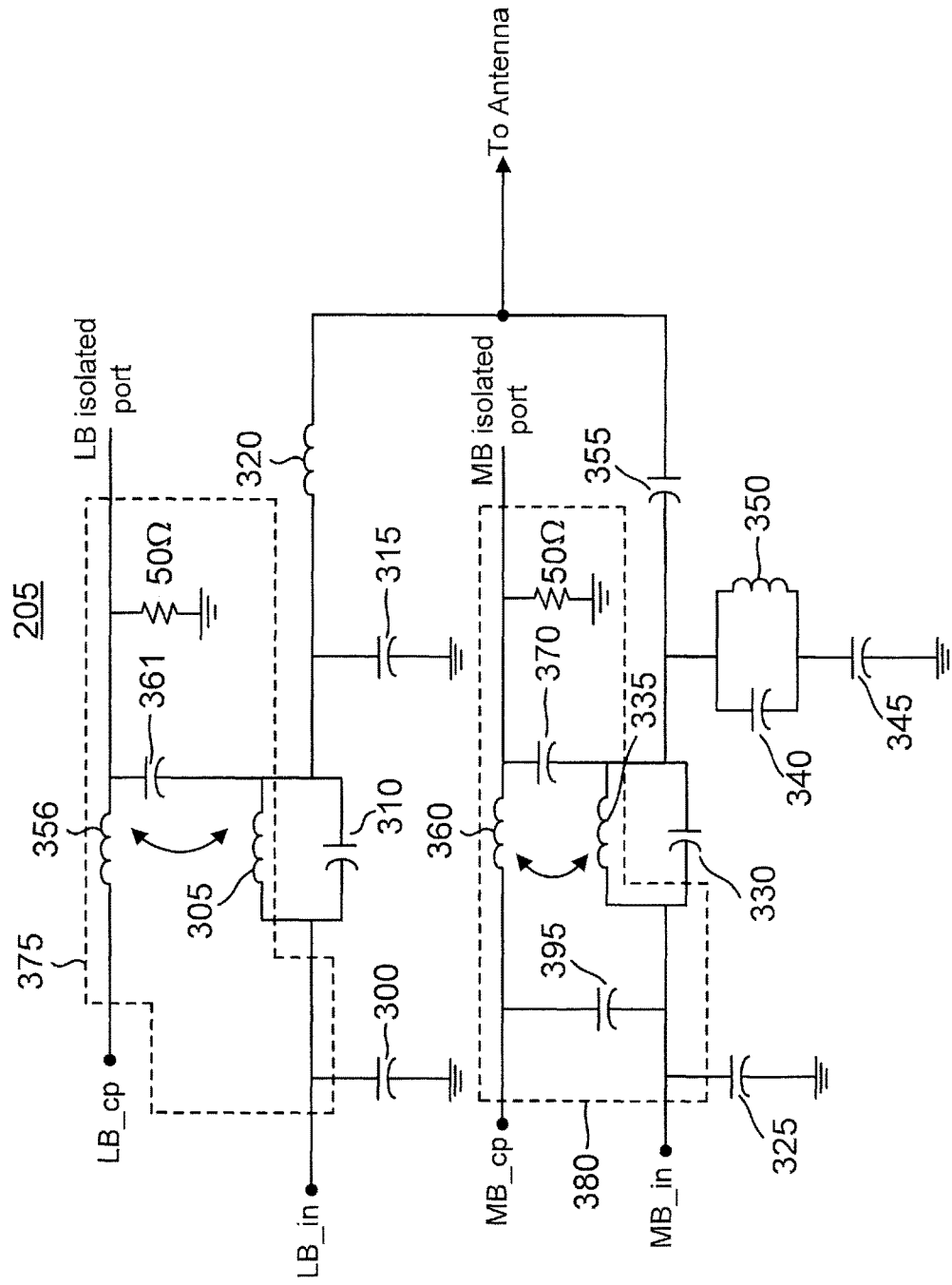
FIG. 3 is a circuit diagram of the integrated RF diplexer of FIG. 2.

An example circuit diagram for an RF diplexer 205 is shown in FIG. 3. For the LB channel, an inductor 305 is the primary inductor for an integrated LB directional coupler 375 whereas an inductor 356 is the secondary inductor. Inductors 305 and 356 are thus arranged to form a transformer as discussed further below. A first terminal of primary inductor 305 couples to the LB input port LB_in. The amplified LB RF input signal from LB PA module 210 (FIG. 2) will thus conduct through primary inductor 305 and induce the LB feedback signal to conduct through secondary inductor 356, which has a first terminal coupled to the LB coupled port LB_cp. A second terminal of primary inductor 305 couples through a capacitor 361 to a second terminal of secondary inductor 356. The second terminal of secondary inductor 356 couples to an LB isolated port. In RF diplexer 205, the characteristic impedance of the LB and MB channels is assumed to be 50Ω. The LB isolated port is thus terminated in a 50Ω matched-load resistor to match this port to the channel impedance. It will be appreciated that channel impedances greater than or less than 50Ω may be used in alternative embodiments.

With regard to the LB channel in RF diplexer 205, the amplified LB RF input signal passes through the LB input port LB_in to conduct through primary inductor 305. The LB input port LB_in also couples to ground through a capacitor 300 and couples to a first terminal of a capacitor 310 coupled in parallel with primary inductor 305. A second terminal of capacitor 310 couples to ground through a capacitor 315 and also couples to through an inductor 320 to drive antenna 220 (FIG. 2) in common with primary inductor 305. It will be appreciated that the inductance of the various inductors and the capacitance of the various capacitors in the LB channel in RF diplexer 205 and in integrated LB directional coupler 375 depend upon the center frequency of the LB channel. Moreover, other arrangements of such circuit elements may be implemented in alternative embodiments. Regardless of the specific implementation, RF diplexer 205 will include a primary inductor 305 that is shared by both the LB channel in RF diplexer 205 and integrated LB directional coupler 375.

The MB channel is analogous in that the MB input port MB_in couples to a first terminal of a primary inductor 335. Primary inductor 335 is arranged to form a transformer with a secondary inductor 360 in an integrated MB directional coupler 380. The MB input terminal MB_in couples to a first terminal of primary inductor 335, which is arranged in parallel with a capacitor 330 analogously to the parallel arrangement of primary inductor 305 and capacitor 310 in the LB channel. A first terminal of secondary inductor 360 couples to the MB coupled port MB_cp to provide the MB feedback signal (FIG. 2). A second terminal of secondary inductor 360 couples to a second terminal of primary inductor 335 through a capacitor 370 analogously to the coupling of the second terminals for primary inductor 305 and secondary inductor 356 through capacitor 361. The second terminal of inductor 360 couples to an MB isolated port and is matched to the characteristic impedance through a matched-load 50Ω resistor. It will be appreciated that other characteristic impedance values may be used in alternative embodiments. In contrast to integrated LB directional coupler 375, the MB coupled port MB_cp and the MB input port MB_in for integrated directional coupler 380 are coupled together through a capacitor 395.

The MB input port MB_in couples to ground through a capacitor 325 analogously to the coupling of the LB input port LB_in to ground through capacitor 300. The second terminal of primary inductor 335 couples to ground through a parallel combination of an inductor 350 and a capacitor 340 that is in series with another capacitor 345. In addition, the second terminal of primary inductor 335 couples to antenna 220 (FIG. 2) through a capacitor 355. It will be appreciated that the inductance of the various inductors and the capacitance of the various capacitors in the MB channel in RF diplexer 205 and in integrated MB directional coupler 380 depends upon the center frequency of the LB channel. Moreover, other arrangements of such circuit elements may be implemented in alternative embodiments. Regardless of the specific implementation, RF diplexer 205 will include a primary inductor 335 that is shared by both the MB channel in RF diplexer 205 and MB directional coupler 380.

Figure 4:
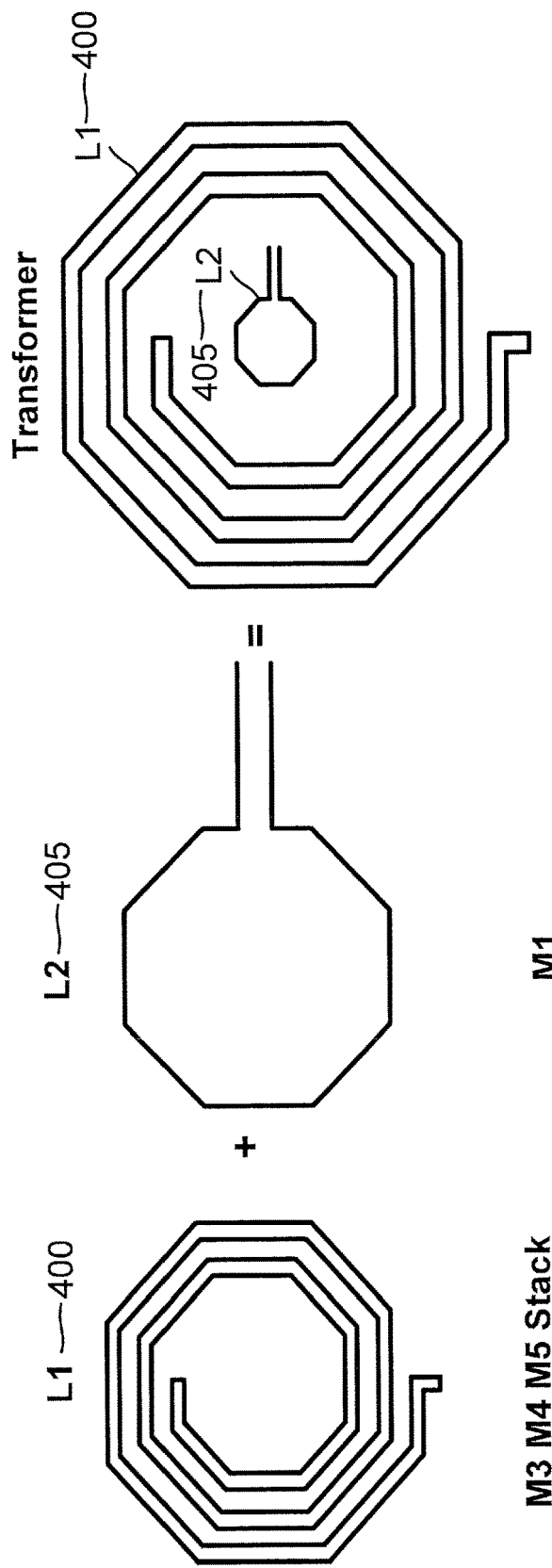
FIG. 4 illustrates a transformer in the integrated RF diplexer of FIG. 3.

The transformer formed by primary inductor 305 and secondary inductor 356 as well as the transformer formed by primary inductor 335 and secondary inductor 360 may be implemented as shown in FIG. 4. A primary inductor L1 400 includes a plurality of relatively thick coils formed in a plurality of metal layers on a substrate such as a semiconductor substrate or a glass substrate. In this fashion, primary inductor L1 400 will have a sufficiently high quality factor (Q), which is desirable for a channel in an RF diplexer. The formation of a secondary inductor L2 405 to provide the channel feedback signal does not require such as high quality factor because the channel feedback signal is much lower power as compared to the relatively high power RF signal driven through the corresponding channel in RF diplexer 205. The secondary inductor L2 405 may thus be formed as a single relatively thin coil in a single metal layer although multiple metal layers and/or coils may be implemented in alternative embodiments. Primary inductor L1 400 and secondary inductor L2 405 are arranged on the substrate so that the central axis of their coils are aligned so that the channel signal driven through the primary inductor L1 400 will magnetically induce the channel feedback signal in the second inductor L2 405.

Figure 5:
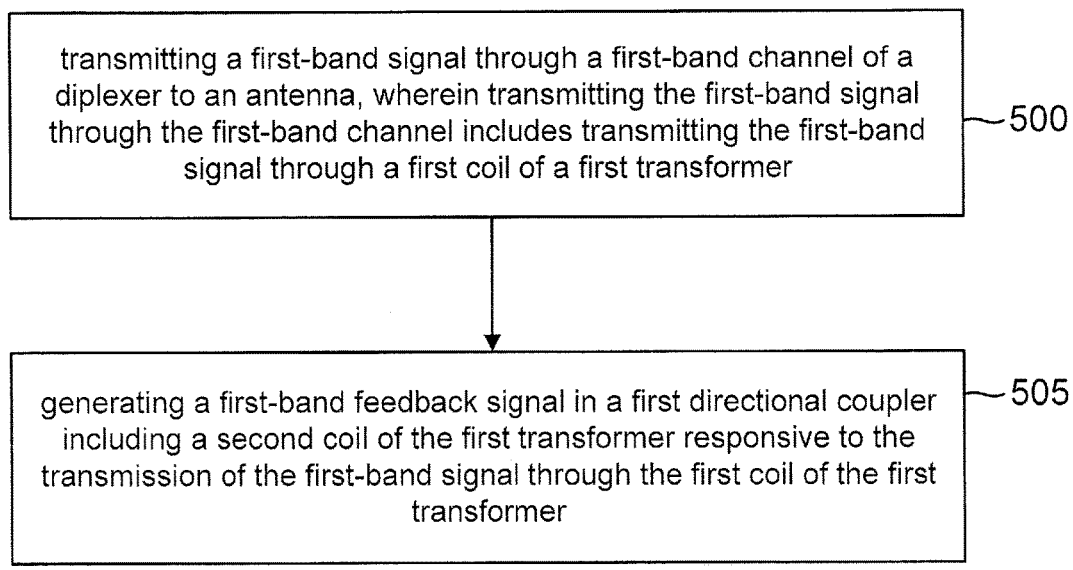
FIG. 5 is a flowchart for a method of operation for an RF diplexer integrated with a directional coupler in accordance with an aspect of the disclosure.

A method of operation of an RF diplexer including an integrated directional coupler for each channel will now be discussed with regard to the flowchart of FIG. 5. The method includes an act 500 of transmitting a first-band signal through a first-band channel of a diplexer to an antenna, wherein transmitting the first-band signal through the first-band channel includes transmitting the first-band signal through a first coil of a first transformer. An example of the first-band channel is either the LB channel or the MB channel of RF diplexer 205. A corresponding first-band signal would thus be the amplified LB input RF signal (if the first-band channel is the LB channel) or the amplified MB input RF signal (if the first-band channel is the MB channel). An example of the first coil is primary inductor 305 or primary inductor 335. Act 500 is thus supported by the transmission of the amplified LB input RF signal through primary inductor 305 or the transmission of the amplified MB input RF signal through primary inductor 335.

The method also includes an act 505 of generating a first-band feedback signal in a first directional coupler including a second coil of the first transformer responsive to the transmission of the first-band signal through the first coil of the first transformer. The generation of the LB feedback signal in secondary inductor 356 or the generation of the MB feedback signal in secondary inductor 360 is an example of act 505.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A circuit comprising:
   an RF diplexer including a first channel and a second channel, wherein the first channel includes a first primary inductor and the second channel includes a second primary inductor;
   a first directional coupler for the first channel including a first transformer that includes the first primary inductor and a first secondary inductor, wherein a first terminal for the first secondary inductor is a coupled port for the first directional coupler and a second terminal for the first secondary inductor is an isolated port for the first directional coupler;
   a second directional coupler for the second channel including a second transformer that includes the second primary inductor and a second secondary inductor, wherein a first terminal for the second secondary inductor is a coupled port for the second directional coupler and a second terminal for the second secondary inductor is an isolated port for the second directional coupler;
   an input port for the first channel coupled to a first terminal for the first primary inductor;
   a first capacitor coupled between a second terminal for the first primary inductor and the second terminal for the first secondary inductor;
   a second capacitor coupled between the input port for the first channel and ground;
   a third capacitor coupled in parallel with the first primary inductor;
   a first antenna;
   a first inductor coupled between the second terminal of the first secondary inductor and the first antenna; and
   a fourth capacitor coupled between the second terminal of the first secondary inductor and ground.

2. The circuit of claim 1, further comprising:
   a substrate;
   a plurality of first metal layers covering the substrate, wherein the plurality of first metal layers are configured to form the first primary inductor as a plurality of first coils; and
   a second metal layer configured to form the first secondary inductor as a second coil, wherein an axis of the second coil is aligned with an axis of the first coils, and wherein the first secondary inductor does not comprise any other metal layers.

3. The circuit of claim 1, further comprising:
   a matched-load resistor coupled between the isolated port for the first channel and ground.

4. The circuit of claim 1, further comprising:
   an input port for the second channel coupled to a first terminal for the second primary inductor; and
   a capacitor coupled between a second terminal for the second primary inductor and the second terminal for the second secondary inductor.

5. The circuit of claim 4, further comprising:
   a matched-load resistor coupled between the isolated port for the second channel and ground.

6. The circuit of claim 4, further comprising:
   a capacitor coupled between the input port for the second channel and ground;
   a capacitor coupled in parallel with the second primary inductor; and
   a capacitor coupled between the input port for the second channel and the coupled port for the second channel.

7. The circuit of claim 4, further comprising:
   a second antenna;
   a capacitor coupled between the second terminal of the second primary inductor and the second antenna.

8. The circuit of claim 7, further comprising:
   a grounding capacitor having a first terminal coupled to ground; and
   a parallel arrangement of a capacitor and an inductor coupled between a second terminal of the grounding capacitor and the second terminal of the second primary inductor.

9. A method, comprising:
   transmitting a first-band signal through a first-band channel of an RF diplexer to an antenna, wherein transmitting the first-band signal through the first-band channel includes transmitting the first-band signal through a first coil of a first transformer, wherein transmitting the first-band signal through the first coil comprises transmitting the first-band signal through a plurality of first coils in a plurality of metal layers; and
   in a first directional coupler, generating a first-band feedback signal at a first terminal of a second coil of the first transformer responsive to the transmission of the first-band signal through the first coil of the first transformer while a second terminal of the second coil of the first transformer is connected to a termination port for the first directional coupler, wherein the second coil is formed in a single metal layer.

10. The method of claim 9, further comprising:
    transmitting a second-band signal through a second-band channel of the RF diplexer to the antenna, wherein transmitting the second-band signal through the second-band channel includes transmitting the second-band signal through a first coil of a second transformer; and generating a second-band feedback signal in a second directional coupler including a second coil of the second transformer responsive to the transmission of the second-band signal through the first coil of the second transformer.

11. The method of claim 10, further comprising:
amplifying a first input signal through a first power amplifier to form the first-band signal transmitted through the first-band channel of the RF diplexer; and
adjusting an amplification of the first input signal by the first power amplifier responsive to the first-band feedback signal.

12. The method of claim 10, wherein the first-band signal and the second-band signal are both cellular telephone signals.

13. The method of claim 11, further comprising:
amplifying a second input signal through a second power amplifier to form the second-band signal transmitted through the second-band channel of the RF diplexer; and
adjusting an amplification of the second input signal by the second power amplifier responsive to the second-band feedback signal.

14. A circuit, comprising:
an antenna;
an RF diplexer including a first channel arranged between a first input port and the antenna, the first channel including a first primary inductor;
a first directional coupler for the first channel including a first transformer that includes the first primary inductor and a first secondary inductor, wherein a first terminal for the first secondary inductor is a coupled port for the first directional coupler and a second terminal for the first secondary inductor is an isolated port for the first directional coupler;
a substrate;
a plurality of first metal layers covering the substrate, wherein the plurality of first metal layers are configured to form the first primary inductor as a plurality of first coils; and
a second metal layer configured to form the first secondary inductor as a second coil, wherein an axis of the second coil is aligned with an axis of the first coils, wherein the first secondary inductor does not include any other metal layers.

15. The circuit of claim 14, wherein the circuit is included within a cellular telephone.

16. The circuit of claim 14, wherein the RF diplexer further includes a second channel arranged between a second input port and the antenna, the second channel including a second primary inductor, the circuit further comprising:
a second directional coupler for the second channel including a second transformer that includes the second primary inductor and a second secondary inductor.

* * * * *